(12) United States Patent
Shimazu

(10) Patent No.: US 8,940,115 B2
(45) Date of Patent: Jan. 27, 2015

(54) WAFER MOUNT DEVICE AND MANUFACTURING METHOD THEREOF

(75) Inventor: Norifumi Shimazu, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 842 days.

(21) Appl. No.: 13/094,171

(22) Filed: Apr. 26, 2011

(65) Prior Publication Data

US 2011/0272899 A1 Nov. 10, 2011

(30) Foreign Application Priority Data

May 7, 2010 (JP) ................................ 2010-107234

(51) Int. Cl.
| | | |
|---|---|---|
| B32B 37/16 | (2006.01) | |
| H01L 21/683 | (2006.01) | |
| H01L 21/67 | (2006.01) | |
| H01L 21/687 | (2006.01) | |

(52) U.S. Cl.
CPC ...... *H01L 21/6831* (2013.01); *H01L 21/67109* (2013.01); *H01L 21/68785* (2013.01)
USPC .............................. 156/87; 156/305; 279/128

(58) Field of Classification Search
CPC ..................... H01L 21/6831; H01L 21/67103; H01L 21/67109; H01L 21/6875; C23C 16/4581; C23C 16/4586
USPC ......... 156/305, 87, 345.51; 279/128; 361/234
See application file for complete search history.

(56) References Cited

U.S. PATENT DOCUMENTS

| | | | |
|---|---|---|---|
| 5,886,863 | A | 3/1999 | Nagasaki et al. |
| 2009/0308538 | A1 | 12/2009 | Yonekura et al. |

FOREIGN PATENT DOCUMENTS

| | | |
|---|---|---|
| JP | 09-045757 A1 | 2/1997 |
| JP | 2003-258072 A1 | 9/2003 |
| JP | 2005-243877 A1 | 9/2005 |
| JP | 2009-302346 A1 | 12/2009 |

OTHER PUBLICATIONS

Japanese Office Action dated Jun. 26, 2012 (with partial English translation).

*Primary Examiner* — Phillip Tucker
(74) *Attorney, Agent, or Firm* — Burr & Brown, PLLC

(57) ABSTRACT

An adhesive layer that bonds the back surface of a plate capable of attracting a wafer and the front surface of a cooling plate together that includes a main adhesive portion, which is made of a hardened matter of a fluid adhesive, and an outer peripheral adhesive portion, gas-supply-hole adhesive portions, lift-pin-hole adhesive portions, and terminal-hole adhesive portions made of a double-faced tape. The tape portions bond the outer peripheral edge on the back surface of the plate and the outer peripheral edge on the front surface of the cooling plate together, and the outer peripheral edges of the holes on the back surface of the plate and the outer peripheral edges of these holes on the front surface of the cooling plate together.

5 Claims, 8 Drawing Sheets (a)

(b)

WAFER MOUNT DEVICE AND MANUFACTURING METHOD THEREOF

BACKGROUND OF THE INVENTION

1. Field of the Invention

The present invention relates to a wafer mount device and a manufacturing method of the wafer mount device.

2. Description of the Related Art

A plasma processing apparatus, such as a plasma CVD apparatus or a plasma etching apparatus, typically uses a wafer mount device for mounting a wafer in a vacuum chamber. The wafer mount device includes an electrostatic chuck for attracting and retaining the wafer, which is subject to plasma processing, and a cooling plate that cools the electrostatic chuck. For example, Japanese Unexamined Patent Application Publication No. 2003-258072 describes a wafer mount device in which an electrostatic chuck made of a ceramic plate is bounded to a cooling plate made of metal by an adhesive layer. In the wafer mount device, the adhesive layer includes an adhesive portion made of a hardened matter of a fluid adhesive and a spacer portion made of a double-faced tape. The spacer portion can equalize the thickness of the adhesive layer.

The wafer mount device described in the aforementioned publication uses the hardened matter of the fluid adhesive for the adhesive layer. A sufficient bonding force can be obtained between the electrostatic chuck and the cooling plate. Hence, it is desired that the wafer mount device is further improved to increase an attractive force and quickness of detachment (hereinafter, referred to as attraction/detachment performance), which are important performances for the wafer mount device.

SUMMARY OF THE INVENTION

The present invention is made in light of the desire, and a main object is to provide a wafer mount device with high attraction/detachment performance while a hardened matter of a fluid adhesive is used, and also to provide a manufacturing method of the wafer mount device.

The inventors of the present invention found that if an electrostatic chuck and a cooling plate are bonded together only by a double-faced tape without a hardened matter of a fluid adhesive, although a bonding force between the electrostatic chuck and the cooling plate is not sufficient, a wafer mount device with higher attraction/detachment performance is obtained as compared with a case in which the hardened matter of the fluid adhesive is used. In addition, as the result of further study, to bond the ceramic plate and the cooling plate together by the hardened matter of the fluid adhesive, the inventors found that high attraction/detachment performance can be obtained by bonding the outer peripheral edge on the back surface of the plate and the outer peripheral edge on the front surface of the cooling plate together by the double-faced tape even if the hardened matter of the fluid adhesive is used.

In particular, a wafer mount device according to the present invention comprising a disk-like ceramic plate being capable of attracting a wafer to a front surface of the plate, a disk-like metal cooling plate, and an adhesive layer that bonds a back surface of the plate and a front surface of the cooling plate together, the adhesive layer including a first adhesive portion made of a hardened matter of a fluid adhesive and a second adhesive portion made of a double-faced tape, wherein the second adhesive portion bonds an outer peripheral edge on the back surface of the plate and an outer peripheral edge on the front surface of the cooling plate together.

In this wafer mount device, the adhesive layer that bonds the back surface of the ceramic plate capable of attracting the wafer and the front surface of the cooling plate together includes the first adhesive portion made of the hardened matter of the fluid adhesive, and the second adhesive portion made of the double-faced tape. The second adhesive portion bonds the outer peripheral edge on the back surface of the plate and the outer peripheral edge on the front surface of the cooling plate together. Accordingly, as compared with a wafer mount device without the second adhesive portion that bonds both the outer peripheral edges together, attraction/detachment performance for the wafer is increased. A mechanism of the increase in attraction/detachment performance is not concrete, but for example, the mechanism may be conceived as follows. In a conventional wafer mount device without the second adhesive portion that bonds both the outer peripheral edges together, outgas of a volatile component may be generated from a hardened matter of a fluid adhesive, the outgas may contaminate the front surface of a plate, and consequently, the outgas may degrade the attraction/detachment performance. In contrast, with the wafer mount device according to the present invention, a mechanism may be conceived that the contamination with the outgas hardly occurs because the first adhesive portion is surrounded by the back surface of the plate, the front surface of the cooling plate, and the second adhesive portion. Here, the first adhesive portion may be made by hardening silicone resin, and the second adhesive portion may be a double-faced tape including an intermediate layer made of polyimide or PET, and sticking layers provided on both surfaces of the intermediate layer and made of the silicone resin or acrylic resin.

In the wafer mount device according to the present invention, the cooling plate may have an injection hole, which penetrates through the cooling plate in a thickness direction and through which the fluid adhesive is injected. Accordingly, after the second adhesive portion bonds the plate and the cooling plate together, the first adhesive portion can be formed by injecting the fluid adhesive through the injection hole into the space surrounded by the back surface of the plate, the front surface of the cooling plate, and the second adhesive portion that bonds both the outer peripheral edges and then hardening the fluid adhesive. Since the first adhesive portion is formed in this way, as compared with a case in which the first adhesive portion is previously formed at one of the plate and the cooling plate and then the plate and the cooling plate are bonded together, the air mixed into the first adhesive portion can be reduced, and thermal uniformity of the wafer mount device can be improved.

In the wafer mount device according to the present invention, the cooling plate and the first adhesive portion may have a through hole, which penetrates through the cooling plate and the first adhesive portion in the thickness direction. Also, the second adhesive portion may bond the outer peripheral edge on the back surface of the plate and the outer peripheral edge on the front surface of the cooling plate together, and also bond the back surface of the plate and an outer peripheral edge of the through hole on the front surface of the cooling plate together. Accordingly, as long as the through hole penetrating through the cooling plate and the first adhesive portion is provided, as compared with the wafer mount device without the second adhesive portion that bonds the back surface of the plate and the outer peripheral edge of the through hole on the front surface of the cooling plate together, the attraction/detachment performance for the wafer is increased. Here, the through hole may penetrate through the cooling plate, the first adhesive portion, and the plate, and the second adhesive portion may bond the outer peripheral edge on the back surface of the plate and the outer peripheral edge on the front surface of the cooling plate together, and also bond an outer peripheral edge of the through hole on the back surface of the plate and the outer peripheral edge of the through hole on the front surface of the cooling plate together.

The manufacturing method of the wafer mount device according to the present invention includes;

(a) a step of preparing a disk-shaped ceramic plate including an electrostatic chuck electrode, and a disk-shaped metal cooling plate having an injection hole and a through hole penetrating through the cooling plate in a thickness direction;

(b) a step of, after the step (a), bonding an outer peripheral edge on a back surface of the plate and an outer peripheral edge on a front surface of the cooling plate together by a double-faced tape, bonding the back surface of the plate and an outer peripheral edge of the through hole on the front surface of the cooling plate together by a double-faced tape, and hence providing a temporary bonded member;

(c) a step of, after the step (b), injecting a fluid adhesive into a space of the temporary bonded member through the injection hole, the space being surrounded by the back surface of the plate, the front surface of the cooling plate, and the double-faced tapes;

and (d) a step of, after the step (c), hardening the fluid adhesive.

With the manufacturing method of the wafer mount device, the back surface of the plate and the front surface of the cooling plate are bonded together by the hardened matter of the fluid adhesive, both the outer peripheral edges are bonded together by the double-faced tape, and the back surface of the plate and the outer peripheral edge of the through hole on the front surface of the cooling plate are bonded together by the double-faced tape. Accordingly, as compared with a configuration without the double-faced tape that bonds both the outer peripheral edges or the double-faced tape that bonds the back surface of the plate and the outer peripheral edge of the through hole on the front surface of the cooling plate together, the wafer mount device with high attraction/detachment performance for the wafer is obtained. Also, since the temporary bonded member including the plate, the cooling plate, and the double-faced tape is fabricated, and then the fluid adhesive is injected. As compared with a case in which the fluid adhesive is previously applied and then the plate and the cooling plate are bonded together, the air mixed into the adhesive layer is reduced. Accordingly, the thermal uniformity of the plate is improved. Since the back surface of the plate and the outer peripheral edge of the through hole on the front surface of the cooling plate are bonded together by the double-faced tape and then the fluid adhesive is injected, the fluid adhesive can be prevented from flowing into the through hole. In this case, the fluid adhesive may be silicone resin. The double-faced tape that bonds the outer peripheral edge on the back surface of the plate and the outer peripheral edge on the front surface of the cooling plate together, and the double-faced tape that bonds the back surface of the plate and the outer peripheral edge of the through hole on the front surface of the cooling plate together may be a double-faced tape including an intermediate layer made of polyimide or PET, and sticking layers provided on both surfaces of the intermediate layer and made of the silicone resin or acrylic resin. Also, the plate may include a through hole penetrating through the plate in the thickness direction. In the step (b), the outer peripheral edge on the back surface of the plate and the outer peripheral edge on the front surface of the cooling plate may be bonded together by the double-faced tape, and also the outer peripheral edge of the through hole on the back surface of the plate and the outer peripheral edge of the through hole on the front surface of the cooling plate may be bonded together by the double-faced tape.

In the manufacturing method of the wafer mount device according to the present invention, in the step (b), a path may be provided, the path communicating with an inner peripheral side and an outer peripheral side of the double-faced tape that bonds the outer peripheral edge on the back surface of the plate and the outer peripheral edge on the front surface of the cooling plate together. In the step (c), the fluid adhesive may be injected into the space through the injection hole such that the air is discharged through the path as the fluid adhesive is injected and that the path is closed with the fluid adhesive last. Accordingly, since the air in the space is discharged through the path when the fluid adhesive is injected, the air mixed into the adhesive layer can be further reduced. Also, in this case, the injection hole may be located at a position deviated from a center axis of the cooling plate. Also, in the step (b), the path may be provided at a position opposite to the injection hole with respect to the center axis of the cooling plate. Accordingly, since the path is located at the position farthest from the injection hole, the path can be reliably closed with the fluid adhesive last.

In the manufacturing method of the wafer mount device according to the present invention provided with the path, in the step (c), after the path is closed with the fluid adhesive, the path may be closed with a double-faced tape from outside. Accordingly, since the outer peripheral surface of the hardened matter of the fluid adhesive is covered with the double-faced tape and hence is not exposed, the attraction/detachment performance for the wafer is increased.

In the manufacturing method of the wafer mount device according to the present invention, in the step (d), after the fluid adhesive is injected into the space in the step (c), the temporary bonded member may be left until an inner pressure of the fluid adhesive in the space is released, and then the fluid adhesive may be hardened. Accordingly, since the fluid adhesive is hardened after the inner pressure is released and the fluid adhesive is evenly provided, the wafer mount device with high thermal uniformity can be obtained.

DETAILED DESCRIPTION OF THE INVENTION

Figure 1:
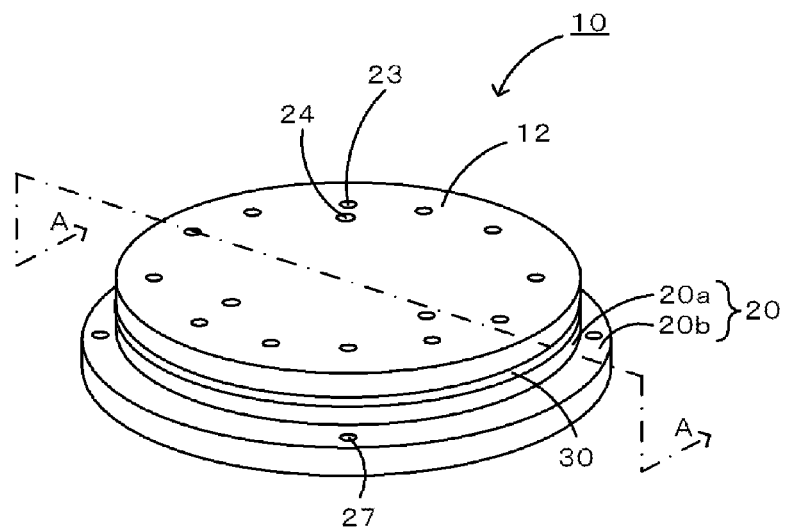
FIG. 1 is a perspective view of a wafer mount device 10.
Figure 2:
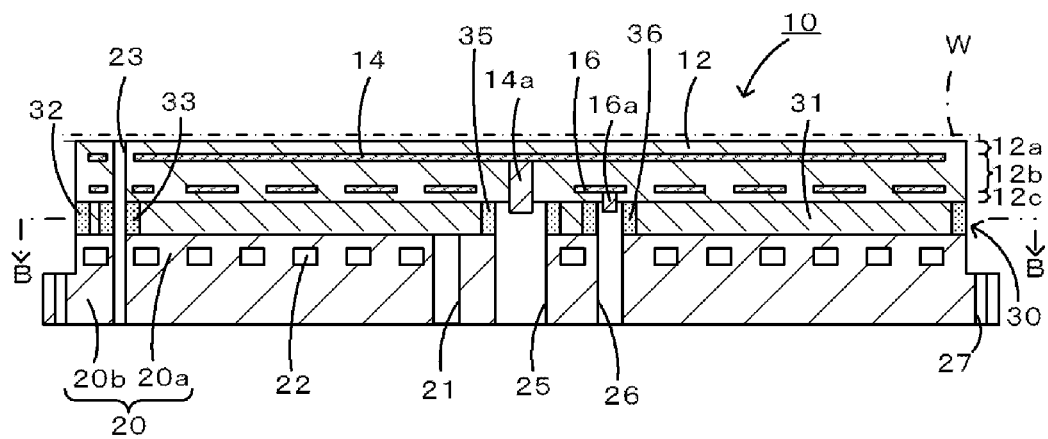
FIG. 2 is a cross-sectional view taken along line A-A in FIG. 1.
Figure 3:
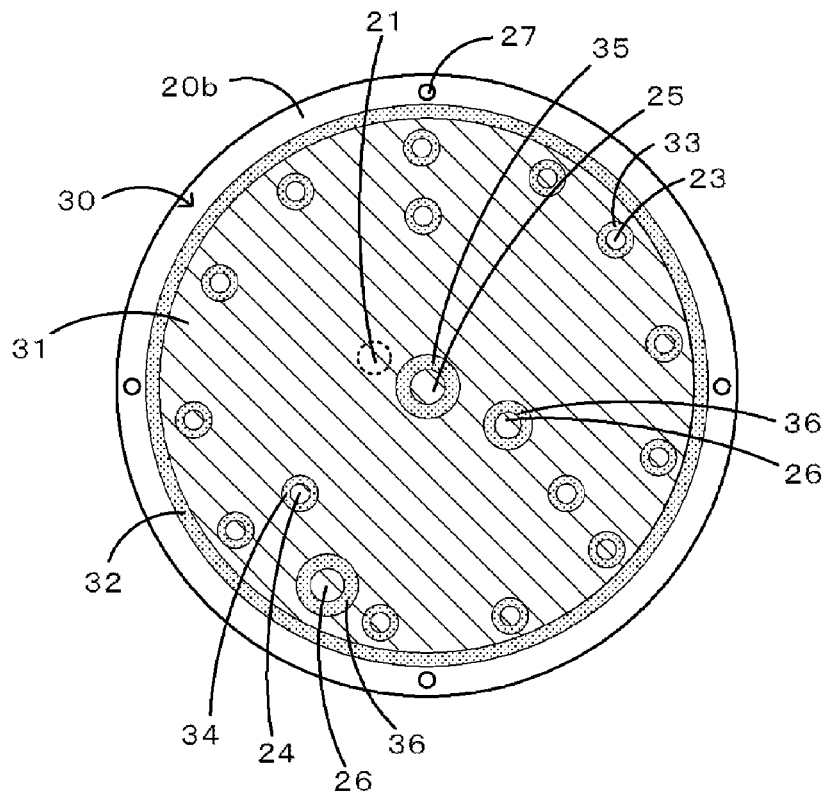
FIG. 3 is a cross-sectional view taken along line B-B in FIG. 2.

Next, an embodiment for implementing the present invention will be described with reference to the drawings. FIG. 1 is a perspective view of a wafer mount device 10 according to an embodiment of the present invention. FIG. 2 is a cross-sectional view taken along line A-A in FIG. 1. FIG. 3 is a cross-sectional view taken along line B-B in FIG. 2.

The wafer mount device 10 includes a plate 12, a cooling plate 20, gas supply holes 23, lift pin holes 24, terminal holes 25 and 26, and an adhesive layer 30. It is to be noted that the gas supply holes 23, the lift pin holes 24, and the terminal holes 25 and 26 correspond to through holes according to the present invention.

As shown in FIG. 2, the plate 12 is a disk-like member made of ceramic (for example, alumina or aluminum nitride), and has an electrostatic electrode 14 and a resistance heating element 16 embedded therein. The electrostatic electrode 14 is formed to have a circular thin-film shape. A conductive terminal 14a is fixed substantially at the center of the electrostatic electrode 14. The terminal 14a is exposed from the bottom portion of the terminal hole 25 that penetrates through the cooling plate 20 and the adhesive layer 30. The terminal 14a is electrically connected with a rod-like terminal (not shown) in the terminal hole 25. If a voltage is applied between the electrostatic electrode 14 and a wafer W, which is mounted on the front surface of the plate 12, through the rod-like terminal, the wafer W is attracted to the plate 12 by an electrostatic force that is generated between the front surface of the plate 12 and the wafer W. The resistance heating element 16 is continuously formed in a pattern so as to extend over the entire surface of the plate 12. Conductive terminals 16a (only one of the terminals 16a is shown) are fixed to one end and the other end of the resistance heating element 16. The terminals 16a are exposed from the bottom portions of the terminal holes 26 that penetrate through the cooling plate 20 and the adhesive layer 30. The terminals 16a are electrically connected with rod-like terminals (not shown) in the terminal holes 26. If a voltage is applied to the resistance heating element 16 through the rod-like terminals, the resistance heating element 16 generates heat and heats the wafer W. It is to be noted that, in the plate 12, a portion above the electrostatic electrode 14 is named dielectric layer 12a, a portion between the electrostatic electrode 14 and the resistance heating element 16 is named intermediate layer 12b, and a portion below the resistance heating element 16 is named lower layer 12c. If the plate 12 is made of alumina, the plate 12 has a high volume resistivity, and hence the plate 12 functions as a Coulomb electrostatic chuck. If the plate 12 is made of aluminum nitride, since the plate 12 has a volume resistivity lower than the volume resistivity of alumina, the plate 12 functions as a Johnson-Rahbek electrostatic chuck.

The cooling plate 20 is a disk-like member with a step. The cooling plate 20 has a shape in which a small-diameter disk portion 20a with substantially the same diameter as the diameter of the plate 12, and a large-diameter disk portion 20b with a diameter larger than the diameter of the small-diameter disk portion 20a are coaxially arranged on each other. The cooling plate 20 is coaxially arranged with respect to the plate 12. The front surface of the small-diameter disk portion 20a is bonded to the back surface of the plate 12 through the adhesive layer 30. The cooling plate 20 is made of metal (for example, aluminum), and has a coolant path 22 embedded therein. A coolant (for example, water) can pass through the coolant path 22. The coolant path 22 is formed to allow the entire surface of the plate 12 to be cooled by the coolant. The coolant path 22 has a supply port and a discharge port (both not shown) for the coolant. Also, the cooling plate 20 has a thermocouple hole 21 that penetrates through the cooling plate 20 in the thickness direction at a position deviated from the center axis of the cooling plate 20. A thermocouple (not shown) is inserted into the thermocouple hole 21, and hence the temperature of the plate 12 is measured. For example, the center axis of the thermocouple hole 21 is located at a position that is deviated from the center axis of the cooling plate 20 by a length corresponding to 22% to 32% of the radius of the cooling plate 20. Further, the large-diameter disk portion 20b has fixing holes 27 in an area outside the small-diameter disk portion 20a. The fixing holes 27 penetrate through only the large-diameter disk portion 20b. The fixing holes 27 are used in a manufacturing process (described later) of the wafer mount device 10. The fixing holes 27 are provided at 4 positions in total as shown in FIG. 3.

The gas supply holes 23 are for supplying backside gas (for example, argon gas or helium gas) from below the cooling plate 20. As shown in FIGS. 1 and 3, the gas supply holes 23 are provided at 12 positions in total of the wafer mount device 10. The backside gas supplied to the gas supply holes 23 fills a very small space present at the back surface of the wafer W when the wafer W is mounted on the front surface of the plate 12, and cools the wafer W by gas thermal conduction.

Lift pins (not shown) are vertically movably inserted into the lift pin holes 24. As shown in FIGS. 1 and 3, the lift pin holes 24 are provided at 3 positions in total of the wafer mount device 10. By moving up the lift pins inserted into the lift pin holes 24, the wafer W mounted on the front surface of the plate 12 can be lifted up.

The gas supply holes 23 and the lift pin holes 24 penetrate through the plate 12, the adhesive layer 30, and the cooling plate 20 in the thickness direction. It is to be noted that the electrostatic electrode 14 and the resistance heating element 16 are designed so as not to be exposed from the inner peripheral surfaces of the gas supply holes 23 and the lift pin holes 24.

Figure 4:
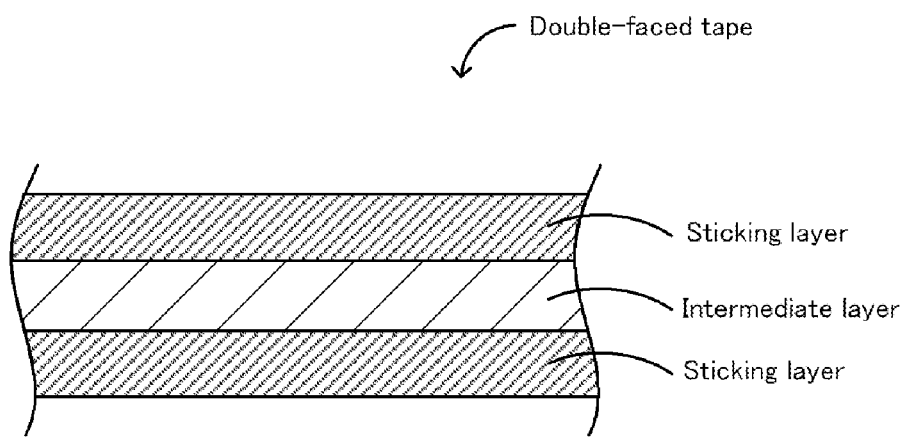
FIG. 4 is a cross-sectional view of a double-faced tape.

The adhesive layer 30 bonds the back surface of the plate 12 and the front surface of the cooling plate 20 together. The adhesive layer 30 has a thickness in a range from 100 to 500 μm. The adhesive layer 30 includes a main adhesive portion 31, an outer peripheral adhesive portion 32, gas-supply-hole adhesive portions 33, lift-pin-hole adhesive portions 34, and terminal-hole adhesive portions 35 and 36. The main adhesive portion 31 corresponds to a first adhesive portion according to the present invention, and the outer peripheral adhesive portion 32, the gas-supply-hole adhesive portions 33, the lift-pin-hole adhesive portions 34, and the terminal-hole adhesive portions 35 and 36 correspond to second adhesive portions according to the present invention. The main adhesive portion 31 is made of a hardened matter of a fluid adhesive. The fluid adhesive is preferably resin, and is any of, for example, silicone resin, acrylic resin, and epoxy resin. The outer peripheral adhesive portion 32 is made of a double-faced tape. FIG. 4 shows a cross-sectional view of the double-faced tape. As shown in FIG. 4, the double-faced tape has a three-layer structure including an intermediate layer and sticking layers provided on both sides of the intermediate layer. The intermediate layer is preferably made of resin, and is, for example, polyimide resin or polyethylene terephthalate (PET) resin. The sticking layers are preferably made of resin, and are any of, for example, silicone resin, acrylic resin, and epoxy resin. The outer peripheral adhesive portion 32 bonds the outer peripheral edge on the back surface of the plate 12 and the outer peripheral edge on the front surface of the cooling plate 20 together. The gas-supply-hole adhesive portions 33, the lift-pin-hole adhesive portions 34, and the terminal-hole adhesive portions 35 and 36 are made of a double-faced tape shown in FIG. 4, and have ring-like shapes when viewed in the thickness direction of the wafer mount device 10. The gas-supply-hole adhesive portions 33 bond the outer peripheral edges of the gas supply holes 23 on the back surface of the plate 12 and the outer peripheral edges of the gas supply holes 23 on the front surface of the cooling plate 20 together. The lift-pin-hole adhesive portions 34 bond the outer peripheral edges of the lift pin holes 24 on the back surface of the plate 12 and the outer peripheral edges of the lift pin holes 24 on the front surface of the cooling plate 20 together. The terminal-hole adhesive portions 35 and 36 bond the back surface of the plate 12 and the outer peripheral edges of the terminal holes 25 and 26 on the front surface of the cooling plate 20 together. The outer peripheral adhesive portion 32, the gas-supply-hole adhesive portions 33, the lift-pin-hole adhesive portions 34, and the terminal-hole adhesive portions 35 and 36 each have a width in a range from 1 to 2 mm in the radial direction. The total bonding area of the outer peripheral adhesive portion 32, the gas-supply-hole adhesive portions 33, the lift-pin-hole adhesive portions 34, and the terminal-hole adhesive portions 35 and 36 is, for example, about 1% to 2% of the area of the front surface of the cooling plate 20. The space surrounded by the back surface of the plate 12, the front surface of the cooling plate 20, and the outer peripheral adhesive portion 32, excluding the gas-supply-hole adhesive portions 33, the lift-pin-hole adhesive portions 34, the terminal-hole adhesive portions 35 and 36, the gas supply holes 23, the lift pin holes 24, and the terminal holes 25 and 26, is occupied by the main adhesive portion 31.

Next, an example of use of the wafer mount device 10 according to this embodiment will be described. The wafer W is mounted on the front surface of the plate 12 of this wafer mount device 10 and the voltage is applied between the electrostatic electrode 14 and the wafer W, so that the wafer is attracted to the plate 12 by the electrostatic force. In this state, the wafer W is processed by film coating through plasma CVD or by plasma etching. In this case, the voltage is applied to the resistance heating element 16, the coolant is circulated through the coolant path 22 of the cooling plate 20, and the backside gas is supplied to the gas supply holes 23, so that the temperature of the wafer W is maintained constant. After the processing of the wafer W is ended, the voltage applied between the electrostatic electrode 14 and the wafer W is changed to zero to eliminate the electrostatic force, and the lift pins (not shown) inserted into the lift pin holes 24 are moved up to/lift up the wafer W from the front surface of the plate 12 by the lift pins. Then, the wafer W lifted up by the lift pins are conveyed to another location by a conveying device (not shown).

An example of a manufacturing method of such a wafer mount device 10 will be described below.

Figure 5:
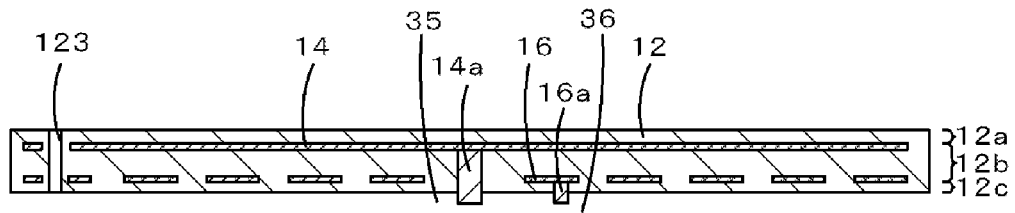
FIG. 5 is an explanatory view showing a plate 12.
Figure 6:
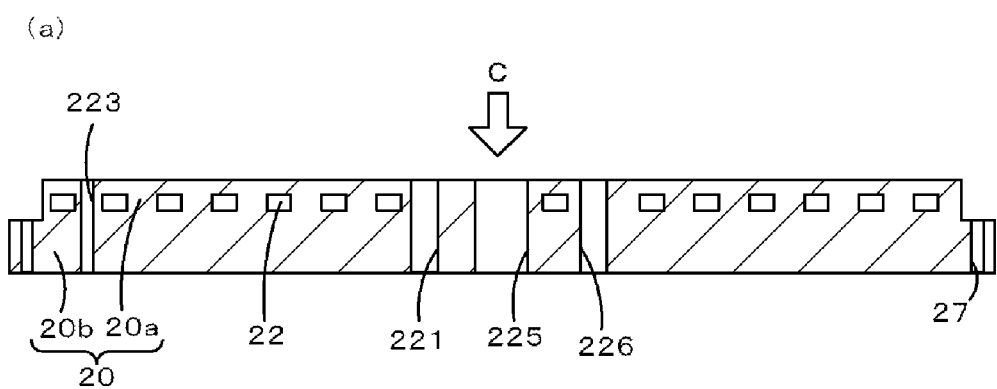
FIG. 6 is an explanatory view showing a cooling plate 20.
Figure 6:
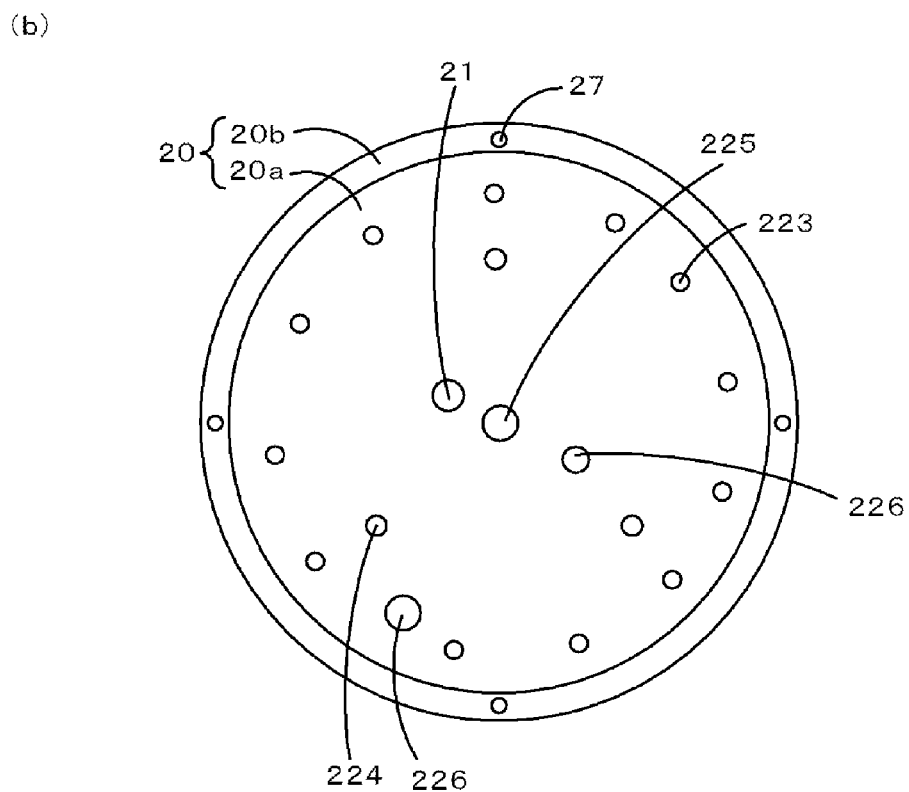

First, the plate 12 and the cooling plate 20 are prepared. FIG. 5 is a cross-sectional view of the plate 12. FIG. 6(*a*) is a cross-sectional view of the cooling plate 20. FIG. 6(*b*) is a view from arrow C in FIG. 6(*a*). Now, fabrication of the plate 12 is described. Alumina powder with a high purity (for example, 99.5%) is baked and grinded to obtain an alumina compact having a density of 99.5% or higher after baking and having a disk-like predetermined shape (for example, with an outer diameter of 310 mm and a thickness of 2 mm), which becomes the dielectric layer 12*a*. Then, a conductive layer, which becomes the electrostatic electrode 14, is formed on the back surface of the alumina compact by screen printing using a print paste, in which mixed powder including tungsten carbide powder and alumina powder is mixed into terpineol. Next, the conductive layer is dried to obtain the electrostatic electrode 14. Then, the columnar terminal 14*a*, which is made of a compact of mixed powder including niobium carbide (NbC) and alumina, is bonded to the center of the electrostatic electrode 14 by a glue. The dielectric layer 12*a* formed with the electrostatic electrode 14 is provided in a die, and alumina powder with a purity of 99% or higher, which becomes the intermediate layer 12*b*, is provided on the surface of the dielectric layer 12*a* with the electrostatic electrode 14 by a predetermined thickness (for example, 3 mm). Then, one-axis pressure compaction is performed. Thus, a first intermediate member is obtained.

Then, a disk-like alumina compact, which becomes the lower layer 12*c*, is prepared by a material similar to that of the dielectric layer 12*a*, in addition to the first intermediate member. The resistance heating element 16 is printed on the prepared alumina compact by using the same print paste as that of the conductive layer. Then, the columnar terminals 16*a* are prepared by a material similar to that of the terminal 14*a*. Holes are made in the alumina compact from the surface opposite to the surface, on which the resistance heating element 16 is printed. The terminals 16*a* are bonded to one and the other ends of the resistance heating element 16 by glue. Then, heating processing is performed by heating the alumina compact, on which the resistance heating element 16 is printed, so as to decompose and eliminate the terpineol and glue. Thus, a second intermediate member is obtained. A hole is made in the second intermediate member to allow the terminal 14*a* of the first intermediate member to penetrate through the hole.

Then, the first intermediate member and the second intermediate member are laminated on each other such that the resistance heating element 16 of the second intermediate member contacts the side, which becomes the intermediate layer 12*b*, of the first intermediate member, and the terminal 14*a* bonded to the electrostatic electrode 14 is inserted into the hole that is made at the center of the second intermediate member. Both intermediate members are provided in a graphite die of a hot press furnace, and pressure baking is performed for both intermediate members by baking through hot pressing with a predetermined pressure. In this way, a ceramic base member, in which the electrostatic electrode 14 and the resistance heating element 16 are embedded, is obtained. The ceramic base member is grinded to obtain a shape of the plate 12 (for example, a disk-like shape having a diameter of 299 mm and a thickness of 3 mm) as shown in FIGS. 1 to 3. Surface grinding is performed for a surface that supports the wafer W and a surface opposite to the support surface, and cylindrical grinding is performed for the ceramic base member by a grinding wheel of diamond. Then, plate-side gas supply holes 123, which are portions of the gas supply holes 23 shown in FIGS. 1 to 3 penetrating through the plate, and plate-side lift pin holes, which are portions of the lift pin holes 24 penetrating through the plate, are formed. Thus, the plate 12 is obtained.

Next, fabrication of the cooling plate 20 will be described. First, a disk-like member with a step with a predetermined size (for example, a diameter of the portion serving as the small-diameter disk portion 20*a* is 299 mm and a diameter of the portion serving as the large-diameter disk portion 20*b* is 344 mm), which is made of aluminum and has the coolant path 22 provided therein, is prepared. Then, cooling-plate-side gas supply holes 223, cooling-plate-side lift pin holes 224, cooling-plate-side terminal holes 225 and 226, which are portions of the gas supply holes 23, the lift pin holes 24, and the terminal holes 25 and 26 penetrating through the cooling plate; and the thermocouple hole 21 and the fixing holes 27 are formed in the disk-like member. Thus, the cooling plate 20 is obtained.

Figure 7:
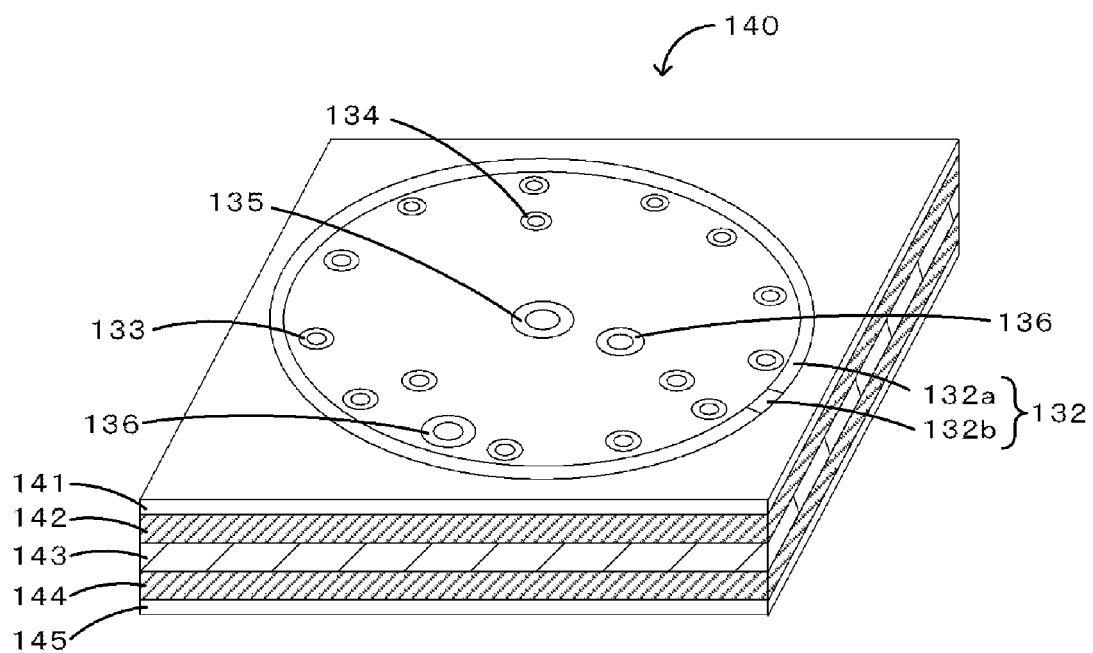
FIG. 7 is an explanatory view of a double-faced tape 140.

Next, an outer peripheral adhesive tape 132, gas-supply-hole adhesive tapes 133, lift-pin-hole adhesive tapes 134, and terminal-hole adhesive tapes 135 and 136, which become the outer peripheral adhesive portion 32, the gas-supply-hole adhesive portions 33, the lift-pin-hole adhesive portions 34, and the terminal-hole adhesive portions 35 and 36 as shown in FIGS. 2 and 3, are prepared. FIG. 7 is an explanatory view showing a double-faced tape 140 including the outer peripheral adhesive tape 132, the gas-supply-hole adhesive tapes 133, the lift-pin-hole adhesive tapes 134, and the terminal-hole adhesive tapes 135 and 136. As shown in FIG. 7, the double-faced tape 140 is formed by laminating a protection film 141, a sticking layer 142, an intermediate layer 143, a sticking layer 144, and a protection film 145 in that order. The protection films 141 and 145 are made of PET resin. The sticking layers 142 and 144 are made of silicone resin. The intermediate layer 143 is made of polyimide resin. For example, the sticking layers 142 and 144 each have a thickness in a range from 56 to 69 µm. For example, the intermediate layer 143 has a thickness in a range from 18 to 22 µm. By cutting the double-faced tape 140 from the protection film 141 to the sticking layer 144, the outer peripheral adhesive tape 132, the gas-supply-hole adhesive tapes 133, the lift-pin-hole adhesive tapes 134, and the terminal-hole adhesive tapes 135 and 136, which respectively have the same shape and which have the same positional relationship as those of the outer peripheral adhesive portion 32, the gas-supply-hole adhesive portions 33, the lift-pin-hole adhesive portions 34, and the terminal-hole adhesive portions 35 and 36 shown in FIGS. 2 and 3, are formed. The outer peripheral adhesive tape 132 includes an outer peripheral adhesive tape 132b with a predetermined length (for example, 10 to 20 mm) formed at a portion corresponding to a position opposite to the thermocouple hole 21 with respect to the center axis of the cooling plate 20 in FIG. 3 by cutting two positions from the protection film 141 to the sticking layer 144; and an outer peripheral adhesive tape 132a formed at the remaining portion.

Figure 8:
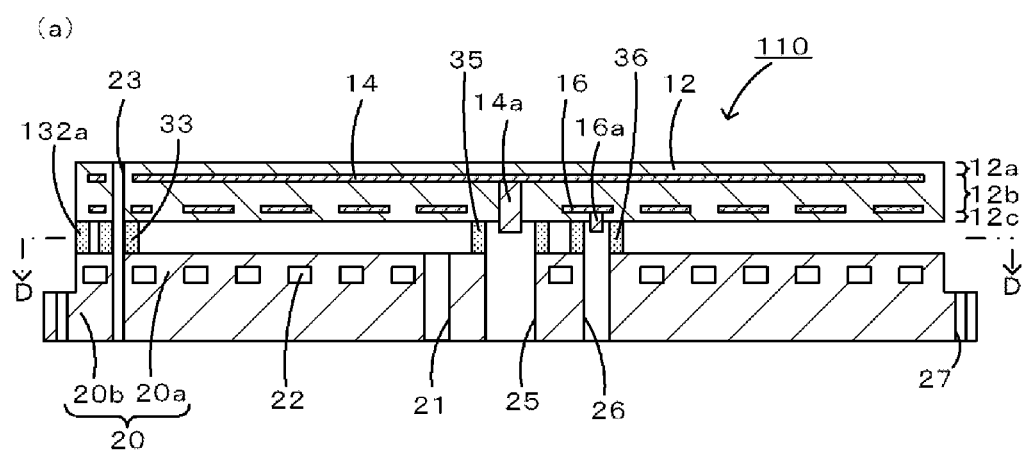
FIG. 8 is an explanatory view of a temporary bonded member 110.
Figure 8:
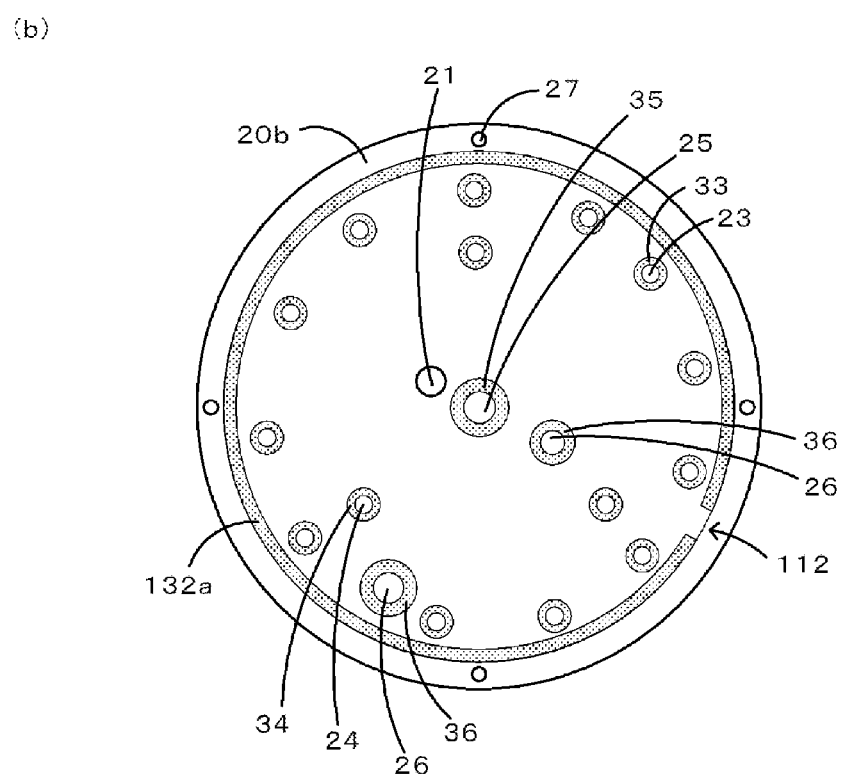

After the double-faced tape 140 shown in FIG. 7 is prepared, only portions of the protection film 141 corresponding to the outer peripheral adhesive tape 132a, the gas-supply-hole adhesive tapes 133, the lift-pin-hole adhesive tapes 134, and the terminal-hole adhesive tapes 135 and 136 are removed to expose the sticking layer 142. In this state, a surface of the double-faced tape 140 at the side of the protection film 141 is bonded to the back surface of the plate 12 such that the outer peripheral adhesive tape 132a faces the outer peripheral edge on the back surface of the plate 12, the gas-supply-hole adhesive tapes 133 and the lift-pin-hole adhesive tapes 134 respectively face the outer peripheral edges of the plate-side gas supply holes 123 and the outer peripheral edges of the plate-side lift pin holes, and the terminals 14a and 16a are respectively arranged within the terminal-hole adhesive tapes 135 and 136. Accordingly, from among the double-faced tape 140, only portions of the sticking layer 142 corresponding to the outer peripheral adhesive tape 132a, the gas-supply-hole adhesive tapes 133, the lift-pin-hole adhesive tapes 134, and the terminal-hole adhesive tapes 135 and 136, which are portions from which the protection film 141 is removed, are bonded to the back surface of the plate 12. Then, from among the double-faced tape 140, the protection film 145 and portions excluding the outer peripheral adhesive tape 132a, the gas-supply-hole adhesive tapes 133, the lift-pin-hole adhesive tapes 134, and the terminal-hole adhesive tapes 135 and 136 are removed. Accordingly, only portions of the sticking layer 142, the intermediate layer 143, and the sticking layer 144 corresponding to the outer peripheral adhesive tape 132a, the gas-supply-hole adhesive tapes 133, the lift-pin-hole adhesive tapes 134, and the terminal-hole adhesive tapes 135 and 136 remain on the back surface of the plate 12. It is to be noted that the outer peripheral adhesive tape 132b included in the removed portions will be used in a later process. In this state, the positions of the sticking layer 144 and the front surface of the cooling plate 20 are aligned with each other such that the outer peripheral adhesive tape 132a faces the outer peripheral edge on the front surface of the cooling plate 20 and that the gas-supply-hole adhesive tapes 133, the lift-pin-hole adhesive tapes 134, and the terminal-hole adhesive tapes 135 and 136 respectively face the outer peripheral edges of the cooling-plate-side gas supply holes 223, the cooling-plate-side lift pin holes 224, and the cooling-plate-side terminal holes 225 and 226 on the front surface of the cooling plate 20. Then, the sticking layer 144 and the front surface of the cooling plate 20 are bonded together to obtain a temporary bonded member 110. FIG. 8($a$) is a cross-sectional view of the temporary bonded member 110. FIG. 8($b$) is a cross-sectional view taken along line D-D in FIG. 8($a$). As shown in the drawings, a path 112 is formed at the temporary bonded member 110. The path 112 communicates with an inner peripheral side and an outer peripheral side of the outer peripheral adhesive tape 132a. The path 112 is formed by removing the outer peripheral adhesive tape 132b when the double-faced tape 140 is bonded to the back surface of the plate 12. It is to be noted that the path 112 is for allowing the air in a space 114 surrounded by the back surface of the plate 12, the front surface of the cooling plate 20, and the outer peripheral adhesive tape 132a of the temporary bonded member 110 to be discharged to the outside when the fluid adhesive is injected, which will be described later.

Figure 9:
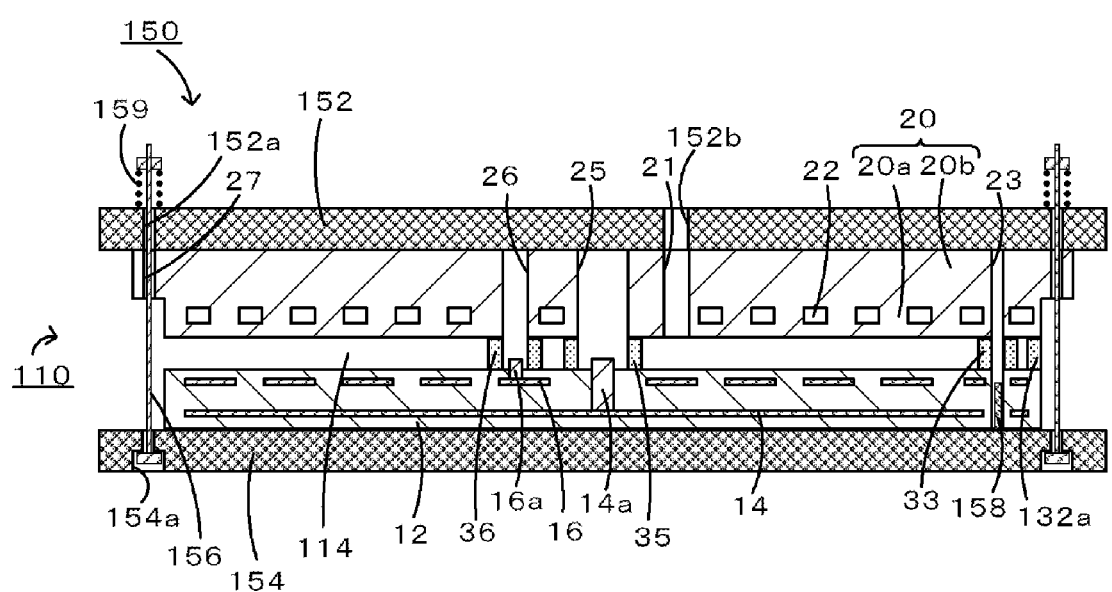
FIG. 9 is an explanatory view showing a state in which the temporary bonded member 110 is fixed by a fixture 150.

Then, the temporary bonded member 110 is fixed by a fixture 150 while the temporary bonded member 110 is arranged upside down, and a spring load is applied to the temporary bonded member 110. FIG. 9 is an explanatory view showing this state. The fixture 150 includes pinching plates 152 and 154 each having a predetermined thickness (for example 10 mm) and made of SUS; four adjuster bolts 156 (only two bolts are shown) for positioning the pinching plates 152 and 154, and the cooling plate 20; and springs 159. The pinching plates 152 and 154 have positioning holes 152a and 154a through which the adjuster bolts 156 are penetrate, and a coupling hole 152b with the same diameter as the diameter of the thermocouple hole 21. Also, the pinching plate 154 has a plurality of protrusions 158 (only one of the protrusions is shown) for positioning the plate 12. The springs 159 are arranged between nuts of the adjuster bolts 156 and the pinching plate 152, and hence a desirable spring load can be applied to the pinching plate 152 by adjusting the positions of the nuts. Fixing of the temporary bonded member 110 by the fixture 150 is performed as follows. First, the protrusions 158 are inserted into the plurality of gas supply holes 23 from the front surface of the plate 12, and the temporary bonded member 110 is mounted on the pinching plate 154. Then, the pinching plate 152 is mounted on the back surface of the cooling plate 20 such that the positioning holes 152a and 154a, and the fixing holes 27 are coaxially located and that the coupling hole 152b and the thermocouple hole 21 communicate with each other. Thus, the temporary bonded member 110 is pinched between the pinching plates 152 and 154. Next, bolts of the adjuster bolts 156 are inserted so as to penetrate through the positioning holes 154a, the fixing holes 27, and the positioning holes 152a in that order. Then, the nuts of the adjuster bolts 156 and the pinching plates 152 pinch the springs 159, the positions of the nuts are adjusted, and the spring load is applied to the pinching plate 152 by elastic forces of the springs 159. With the spring load, the pinching plates 152 and 154 are pushed to move towards each other, and hence the pinching plates 152 and 154 pinch the temporary bonded member 110. The spring load at this time is adjusted to be, for example, a pressure in a range from 0.005 to 0.02 MPa, and more preferably a pressure of 0.011 MPa, in terms of a surface pressure at the back surface of the cooling plate 20. Accordingly, the temporary bonded member 110 is fixed by the fixture 150, and hence the outer peripheral adhesive tape 132a, the gas-supply-hole adhesive portions 33, the lift-pin-hole adhesive portions 34, and the terminal-hole adhesive portions 35 and 36 can be prevented from being removed from the plate 12 and the cooling plate 20.

Figure 10:
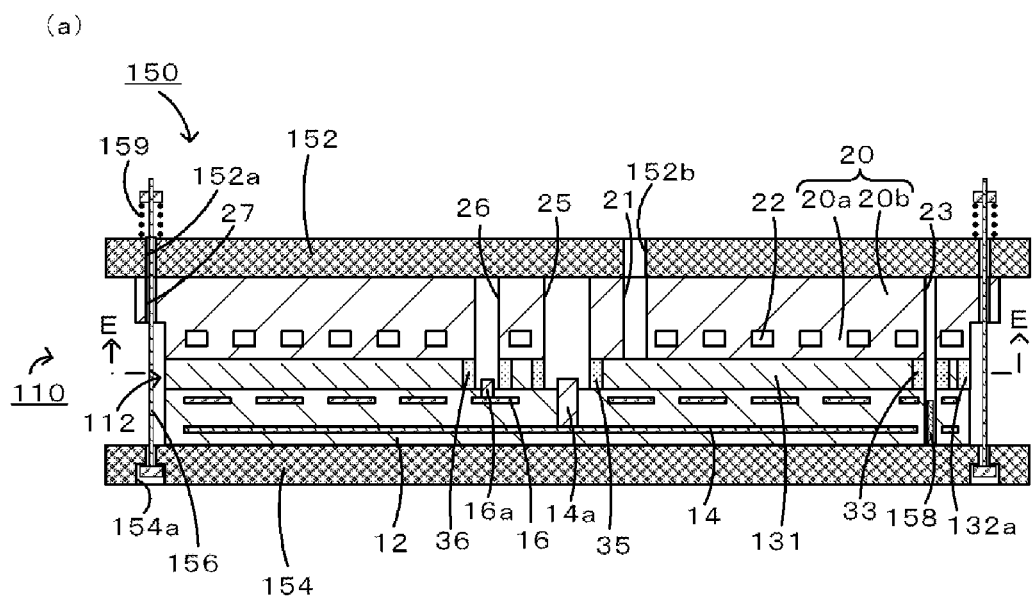
FIG. 10 is an explanatory view of the temporary bonded member 110 to which a fluid adhesive 131 is injected.
Figure 10:
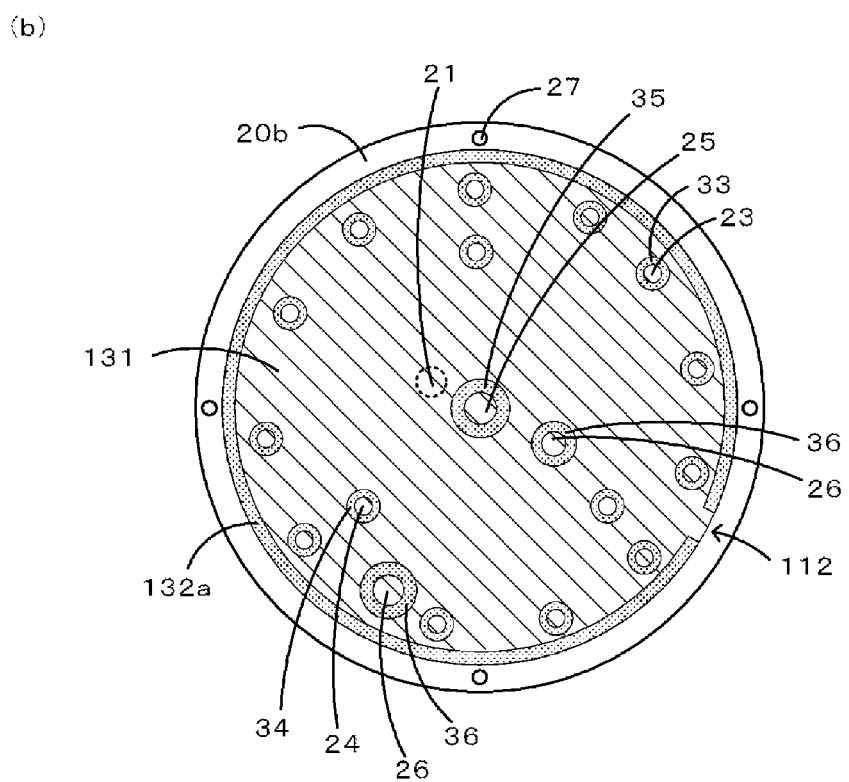
Figure 11:
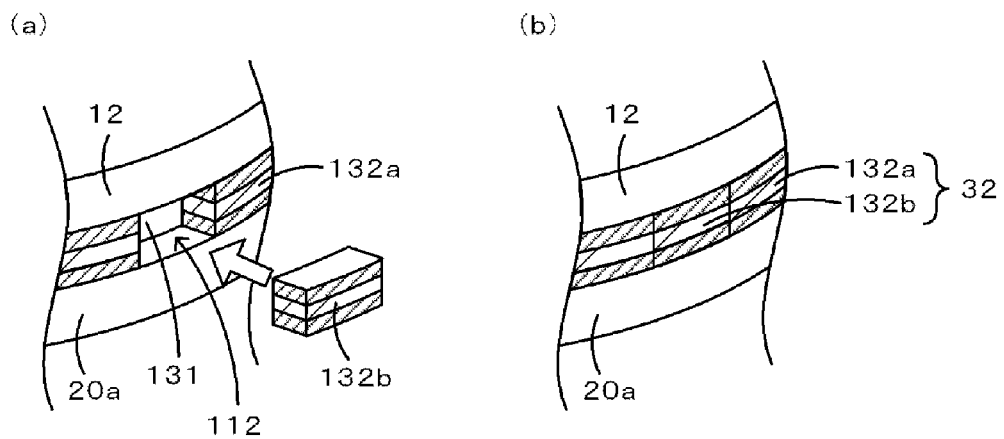
FIG. 11 is an explanatory view showing a state in which a path 112 is sealed.

After the temporary bonded member 110 is fixed by the fixture 150, the fluid adhesive 131 made of silicone resin is injected into the space 114 of the temporary bonded member 110 from outside through the coupling hole 152b and the thermocouple hole 21, which communicate with each other, with a predetermined pressure (for example, a pressure in a range from 0.01 to 0.1 MPa, and more preferably a pressure of 0.04 MPa). Accordingly, the injected fluid adhesive 131 is spread in the space 114 from the position of the thermocouple hole 21, and the space 114 becomes filled with the fluid adhesive 131. It is to be noted that the fluid adhesive 131 does not flow into the gas supply holes 23, the lift pin holes 24, and the terminal holes 25 and 26 because of the gas-supply-hole adhesive portions 33, the lift-pin-hole adhesive portions 34, and the terminal-hole adhesive portions 35 and 36. Also, the air in the space 114 is pushed out by the fluid adhesive 131, and is discharged through the path 112. In the space 114, the path 112 is located at the position farthest from the thermocouple hole 21, which is the injection hole for the fluid adhesive 131, the fluid adhesive 131 reaches the path 112 last in the space 114, and closes the path 112. When the path 112 is closed, the injection of the fluid adhesive 131 is ended. FIG. 10(a) is a cross-sectional view of the temporary bonded member 110 at this time. FIG. 10(b) is a cross-sectional view taken along line E-E in FIG. 10(a). Then, the outer peripheral adhesive tape 132b is used to close the path 112 from outside, and hence the path 112 is sealed. FIG. 11 is an explanatory view showing a state in which the path 112 is sealed. FIG. 11(a) shows a state in which the outer peripheral adhesive tape 132b is bonded from outside of the path 112. FIG. 11(b) shows a state after the path 112 is sealed with the outer peripheral adhesive tape 132b. As shown in the drawings, the path 112 is sealed with the outer peripheral adhesive tape 132b such that the outer peripheral adhesive tape 132b bonds the outer peripheral edge on the back surface of the plate 12 and the outer peripheral edge on the front surface of the cooling plate 20 together like the outer peripheral adhesive tape 132a and that the outer peripheral adhesive tape 132b continuously extends to the outer peripheral adhesive tape 132a in the path 112. Hence, the outer peripheral adhesive tape 132a and the outer peripheral adhesive tape 132b are integrated and serve as the outer peripheral adhesive portion 32 as shown in FIGS. 2 and 3. Since the path 112 is sealed, a portion from which the fluid adhesive 131 is no longer present at the side surface of the temporary bonded member 110.

Then, the temporary bonded member 110 is left in a stationary manner in the atmosphere and waits until the inner pressure of the fluid adhesive 131 injected into the space 114 is released. The waiting time may be appropriately determined depending on the material and injection pressure of the fluid adhesive 131. For example, the waiting time may be 10 hours. Then, the temporary bonded member 110 is put in an atmosphere furnace and the fluid adhesive 131 is hardened under predetermined conditions (for example, at a temperature in a range from 80° C. to 150° C. for a period in a range from 1 to 12 hours). Then, the fixture 150 is detached and the temporary bonded member 110 is baked in vacuum (for example, less than $1 \times 10^{-3}$ Pa) under predetermined conditions (for example, at a temperature in a range from 145° C. to 155° C. for a period in a range from 70 to 90 hours), so that the fluid adhesive 131 is completely hardened. Accordingly, the fluid adhesive 131 is hardened and becomes the main adhesive portion 31. Thus, the wafer mount device 10 can be obtained. It is to be noted that the bonding property of the double-faced tape is not affected under the conditions for hardening the fluid adhesive 131.

With the wafer mount device 10 according to this embodiment described above in detail, since the outer peripheral adhesive portion 32 bonds the outer peripheral edge on the back surface of the plate 12 and the outer peripheral edge on the front surface of the cooling plate 20 together, the attraction/detachment performance for the wafer W is higher than that of a wafer mount device without the outer peripheral adhesive portion 32 that bonds both the outer peripheral edges together. Also, since the gas-supply-hole adhesive portions 33 and the lift-pin-hole adhesive portions 34 bond the outer peripheral edges of the gas supply holes 23 and the lift pin holes 24 on the back surface of the plate 12 and the outer peripheral edges of the gas supply holes 23 and the lift pin holes 24 on the front surface of the cooling plate 20 together, and since the terminal-hole adhesive portions 35 and 36 bond the back surface of the plate 12 and the outer peripheral edges of the terminal holes 25 and 26 on the front surface of the cooling plate 20 together, the attraction/detachment performance for the wafer W is higher than that of the wafer mount device without the gas-supply-hole adhesive portions 33, the lift-pin-hole adhesive portions 34, and the terminal-hole adhesive portions 35 and 36.

Also, with the above-described manufacturing method of the wafer mount device 10 according to this embodiment, the temporary bonded member 110 including the plate 12, the cooling plate 20, the outer peripheral adhesive tape 132a, the gas-supply-hole adhesive tapes 133, the lift-pin-hole adhesive tapes 134, and the terminal-hole adhesive tapes 135 and 136 is fabricated, and then the fluid adhesive 131 is injected. Accordingly, the air that is mixed into the adhesive layer 30 is reduced as compared with a case in which the fluid adhesive 131 is applied on the back surface of the plate 12 or the front surface of the cooling plate 20 and then both the plate 12 and the cooling plate 20 are bonded together. Accordingly, thermal uniformity of the plate 12 is improved. Further, since the thermocouple hole 21, which becomes the injection hole for the fluid adhesive 131, is formed at the position deviated from the center axis of the cooling plate 20, and the path 112 is formed at the position opposite to the thermocouple hole 21 with respect to the center axis, the path 112 is located at the position farthest from the thermocouple hole 21. Accordingly, when the fluid adhesive 131 is injected, the path 112 is closed last. The air in the space 114 can be discharged through the path 112 and the air that is mixed into the adhesive layer 30 can be reduced. Further, since the path 112 is closed with the fluid adhesive 131 and then the path 112 is closed by the outer peripheral adhesive tape 132b from outside, the outer peripheral surface of the hardened matter of the fluid adhesive 131 is covered with the outer peripheral adhesive tapes 132a and 132b and hence is not exposed. Accordingly, the attraction/detachment performance for the wafer w is increased. Further, after the fluid adhesive 131 is injected into the space 114, the temporary bonded member 110 is left in a stationary manner in the atmosphere and waits until the inner pressure of the fluid adhesive 131 is released, and then the fluid adhesive 131 is hardened. Accordingly, the inner pressure of the injected fluid adhesive becomes uniform, and hence the wafer mount device with high thermal uniformity is obtained.

The present invention is not limited to the above-described embodiment, and may be implemented in various forms within the technical scope of the present invention.

For example, in the above-described manufacturing method of the wafer mount device 10, the fluid adhesive 131 is injected from the thermocouple hole 21. However, the injection hole for the fluid adhesive 131 is not limited to the thermocouple hole 21. For example, a hole that is dedicated to the injection but does not have other purpose of use may be formed in the cooling plate 20.

In the above-described manufacturing method of the wafer mount device 10, the path 112 is formed by removing the outer peripheral adhesive tape 132b when the double-faced tape 140 is bonded to the back surface of the plate 12. However, the path 112 may be formed by another method. For example, the path 112 may be formed by making a hole in the outer peripheral adhesive tape 132 after the outer peripheral adhesive tape 132 is bonded to the back surface of the plate 12 and to the front surface of the cooling plate 20.

Figure 12:
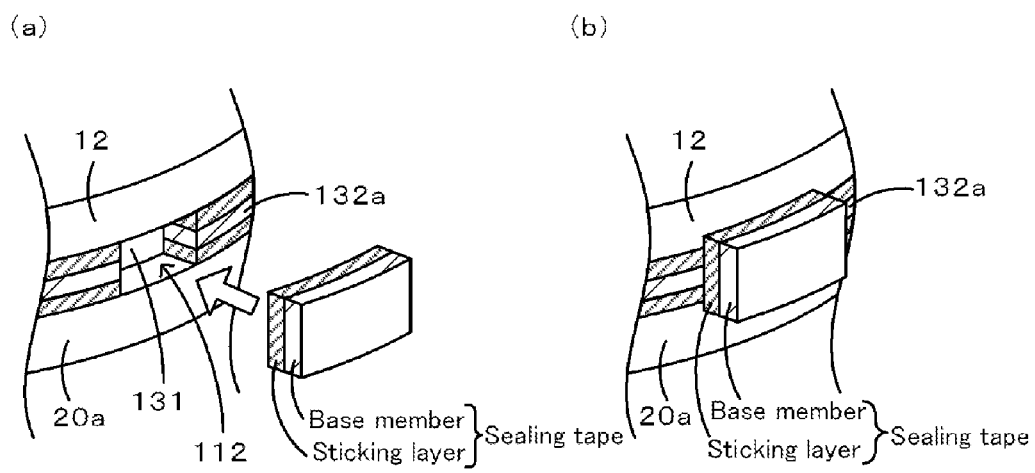
FIG. 12 is an explanatory view showing a state in which the path 112 is sealed by another method.

In the above-described manufacturing method of the wafer mount device 10, the path 112 is sealed with the outer peripheral adhesive tape 132b as shown in FIG. 11. However, the path 112 may be sealed by another method. For example, as shown in FIG. 12, a sealing tape including a sticking layer and a base member may be used. The path 112 can be sealed by bonding this sealing tape such that the sticking layer is bonded to the outer peripheral surface of the outer peripheral adhesive tape 132a to cover the path 112. In this case, the sticking layer of the sealing tape may be made of the same material as the material of the sticking layers 142 and 144 of the double-faced tape 140, and the base member of the sealing tape may be made of the same material as the material of the intermediate layer 143 of the double-faced tape 140.

In the above-described manufacturing method of the wafer mount device 10, the temporary bonded member 110 may be formed by bonding the sticking layer 142 of the double-faced tape 140 to the back surface of the plate 12 and then bonding the sticking layer 144 of the double-faced tape 140 to the front surface of the cooling plate 20. However, the sticking layer 144 of the double-faced tape 140 may be bonded to the front surface of the cooling plate 20 and then the sticking layer 142 of the double-faced tape 140 may be bonded to the back surface of the plate 12.

In the above-described manufacturing method of the wafer mount device 10, the outer peripheral adhesive tape 132a, the gas-supply-hole adhesive tapes 133, the lift-pin-hole adhesive tapes 134, and the terminal-hole adhesive tapes 135 and 136 are formed of the single double-faced tape 140. However, two or more sheets of double-faced tapes may be laminated on each other and the respective adhesive tapes may be formed of the laminated double-faced tapes. For example, the double-faced tape 140 may be bonded to the back surface of the plate 12, then a double-faced tape with cutting at the same positions as the cutting of the double-faced tape 140 may be bonded to the double-faced tape 140 such that the cutting positions are aligned, and hence the laminated two double-faced tapes may form the outer peripheral adhesive tape 132a, the gas-supply-hole adhesive tapes 133, the lift-pin-hole adhesive tapes 134, and the terminal-hole adhesive tapes 135 and 136. Accordingly, the thickness of the outer peripheral adhesive tape 132a, the gas-supply-hole adhesive tapes 133, the lift-pin-hole adhesive tapes 134, and the terminal-hole adhesive tapes 135 and 136 can be adjusted.

In the above-described manufacturing method of the wafer mount device 10, when the sticking layer 144 corresponding to the outer peripheral adhesive tape 132a, the gas-supply-hole adhesive tapes 133, the lift-pin-hole adhesive tapes 134, and the terminal-hole adhesive tapes 135 and 136 is bonded to the front surface of the cooling plate 20, a plurality of spacers that are formed of circular double-faced tapes may be bonded to the front surface of the cooling plate 20. If the spacers are arranged, for example, such that bonding areas of the outer peripheral adhesive tape 132a, the gas-supply-hole adhesive tapes 133, the lift-pin-hole adhesive tapes 134, the terminal-hole adhesive tapes 135 and 136, and the spacers per unit area are substantially evenly arranged in the entire front surface of the cooling plate 20, when the spring load is applied from the springs 159 to the temporary bonded member 110, the flatness of the front surface of the plate 12 can be prevented from being degraded. Such spacers are described in, for example, Japanese Unexamined Patent Application Publication No. 2003-258072.

In the above-described wafer mount device 10, the outer peripheral adhesive portion 32, the gas-supply-hole adhesive portions 33, the lift-pin-hole adhesive portions 34, and the terminal-hole adhesive portions 35 and 36 have widths in the radial direction, for example, in a range from 1 to 2 mm. The outer peripheral adhesive portion 32, the gas-supply-hole adhesive portions 33, the lift-pin-hole adhesive portions 34, and the terminal-hole adhesive portions 35 and 36 may have the same width or different widths in the radial direction. For example, the outer peripheral adhesive portion 32 may have a width in the radial direction larger than widths in the radial direction of the gas-supply-hole adhesive portions 33, the lift-pin-hole adhesive portions 34, and the terminal-hole adhesive portions 35 and 36.

In the above-described wafer mount device 10, the thermocouple hole 21 does not penetrate through the main adhesive portion 31 as shown in FIG. 2. However, the thermocouple hole 21 may penetrate through the main adhesive portion 31 and the bottom surface of the thermocouple hole 21 may be the back surface of the plate 12. Accordingly, the thermocouple that is inserted into the thermocouple hole 21 can be arranged at a position closer to the plate 12. In this case, like the terminal-hole adhesive portions 35 and 36 for the terminal holes 25 and 26, the back surface of the plate 12 and the outer peripheral edge of the thermocouple hole 21 on the front surface of the cooling plate 20 may be bonded together by a thermocouple-hole adhesive portion that is formed of a double-faced tape.

In the above-described manufacturing method of the wafer mount device 10, the path 112 is formed at the position opposite to the thermocouple hole 21 with respect to the center axis of the cooling plate 20. However, the position of the path 112 is not particularly limited as long as the air in the space 114 can be discharged to the outside. The path 112 is still preferably formed at the position opposite to the thermocouple hole 21 with respect to the center axis of the cooling plate 20 because the path 112 can be closed last as described above.

In the above-described manufacturing method of the wafer mount device 10, when the temporary bonded member is fixed by the fixture 150, the adjuster bolts 156 penetrate through the fixing holes 27. However, it is not limited thereto, and the temporary bonded member 110 may be fixed by another method other than the fixture 150. In this case, the fixing holes 27 may not be formed in the cooling plate 20.

EXAMPLES

Example 1

In Example 1, the wafer mount device 10 according to the embodiment illustrated in FIGS. 1 to 3 was manufactured by the manufacturing method described with reference to FIGS. 5 to 11. In particular, the wafer mount device 10 was manufactured as follows.

First, alumina powder with a purity of 99.5% was baked and grinded to obtain an alumina compact having a density of 99.5% or higher after baking and having a disk-like shape with an outer diameter of 310 mm and a thickness of 2 mm, serving as the dielectric layer 12a. Next, a conductive layer, serving as the electrostatic electrode 14, was formed on the back surface of the alumina compact by screen printing using a print paste, in which mixed powder including tungsten carbide powder and alumina powder was mixed into terpineol. The conductive layer was dried and obtained as the electrostatic electrode 14 with a diameter of 294 mm. Then, the columnar terminal 14a, which was made of a compact of mixed powder including niobium carbide (NbC) and alumina and had a diameter of 1 mm, was bonded to the center of the electrostatic electrode 14 by a glue. The dielectric layer 12a formed with the electrostatic electrode 14 was provided in a die, and alumina powder with a purity of 99.5%, serving as the intermediate layer 12b, was provided on the surface of the dielectric layer 12a with the electrostatic electrode 14 by a thickness of 3 mm. Thus, one-axis pressure compaction was performed. Then, a first intermediate member was obtained.

Then, a disk-like alumina compact, serving as the lower layer 12c, was prepared by a material similar to that of the dielectric layer 12a, in addition to the first intermediate member. The resistance heating element 16 was printed on the prepared alumina compact by using the same print paste as that of the conductive layer. Then, the columnar terminals 16a with a diameter of 2 mm were prepared by a material similar to that of the terminal 14a. Holes were made in the alumina compact from the surface opposite to the surface, on which the resistance heating element 16 was printed. The terminals 16a were bonded to one and the other ends of the resistance heating element 16 by glue. Then, heating processing was performed by heating the alumina compact, on which the resistance heating element 16 was printed, so as to decompose and eliminate the terpineol and glue. Thus, a second intermediate member was obtained. A hole was made in the second intermediate member to allow the terminal 14a of the first intermediate member to penetrate through the hole.

The first and second intermediate layers were laminated on each other, the laminated member was provided in a graphite die of a graphite hot press furnace, pressure baking was performed for both intermediate members by baking through one-axis pressing with a pressure of 10 MPa under conditions including a pressure of 1.02 nitrogen atmospheres and a temperature rise speed of 500° C./h, the maximum temperature of 1650° C. was maintained for 1 hour, and then the laminated member was cooled in the furnace. In this way, a ceramic base member, in which the electrostatic electrode 14 and the resistance heating element 16 were embedded, was obtained. The ceramic base member was grinded to obtain a disk-like shape with a diameter of 299 mm and a thickness of 3 mm. Surface grinding was performed for a surface that supports the wafer W and a surface opposite to the support surface, and cylindrical grinding was performed for the ceramic base member by a grinding wheel of diamond. Thus, the plate-side gas supply holes 123 and the plate-side lift pin holes shown in FIG. 5 were formed, and the plate 12 was obtained. The plate-side gas supply holes 123 each had an inner diameter of 0.8 mm, and the plate-side lift pin holes each had an inner diameter of 3.5 mm.

Next, the cooling plate 20 was fabricated. First, a disk-like member with a step, which was made of aluminum and had the coolant path 22 provided therein, was prepared. Regarding the disk-like member, the portion serving as the small-diameter disk portion 20a had a diameter of 299 mm and a thickness of 6 mm, and the portion serving as the large-diameter disk portion 20b had a diameter of 344 mm and a thickness of 29 mm. The cooling-plate-side gas supply holes 223, the cooling-plate-side lift pin holes 224, the cooling-plate-side terminal holes 225 and 226, the thermocouple hole 21, and the fixing holes 27 shown in FIG. 6 were formed in the disk-like member. The center axis of the thermocouple hole 21 was formed at a position that was deviated from the center axis of the cooling plate 20 by a length corresponding to 30% of the radius of the cooling plate 20. Also, the thermocouple hole 21 had an inner diameter of 8 mm, the cooling-plate-side terminal holes 225 each had an inner diameter of 6 mm, the cooling-plate-side terminal hole 226 near the center axis of the cooling plate 20 had an inner diameter of 8 mm, and the cooling-plate-side terminal hole 226 near the outer periphery of the cooling plate 20 had an inner diameter of 8 mm.

Next, the double-faced tape 140 was prepared. As described above, the outer peripheral adhesive tapes 132a and 132b, the gas-supply-hole adhesive tapes 133, the lift-pin-hole adhesive tapes 134, the terminal-hole adhesive tapes 135 and 136, and the circular spacers were formed by cutting the double-faced tape 140. The cooling plate 20 and the plate 12 were bonded together by this double-faced tape 140, and hence the temporary bonded member 110 was obtained. The double-faced tape 140 used here included the protection films 141 and 145 made of PET resin, the sticking layers 142 and 144 made of silicone resin, and the intermediate layer 143 made of polyimide resin. Also, the thickness of the used double-faced tape 140 excluding the protection films 141 and 145 was 145 µm. The thickness of each of the sticking layers 142 and 144 was 62.5 µm. The thickness of the intermediate layer 143 was 20 µm. Also, the outer peripheral adhesive tapes 132a and 132b, the gas-supply-hole adhesive tapes 133, the lift-pin-hole adhesive tapes 134, and the terminal-hole adhesive tapes 135 and 136 each had a width in the radial direction of 2 mm, and the path 112 had a length of 20 mm. The spacers each had a diameter of 5 mm. Five spacers in total were formed of the double-faced tape 140 and bonded such that bonding areas of the outer peripheral adhesive tape 132a, the gas-supply-hole adhesive tapes 133, the lift-pin-hole adhesive tapes 134, the terminal-hole adhesive tapes 135 and 136, and the spacers per unit area of 10000 $mm^2$ on the front surface of the cooling plate 20 were substantially evenly arranged in the entire front surface of the cooling plate 20. The total bonding area of the outer peripheral adhesive portion 32, the gas-supply-hole adhesive portions 33, the lift-pin-hole adhesive portions 34, the terminal-hole adhesive portions 35 and 36, and the spacers was 1.4% of the area of the front surface of the cooling plate 20.

Then, as shown in FIG. 9, the temporary bonded member 110 was fixed by the fixture 150 while the temporary bonded member 110 was arranged upside down, and a spring load was applied to the temporary bonded member 110 such that the surface pressure at the back surface of the cooling plate 20 was 0.011 MPa. In this state, the fluid adhesive 131 made of silicone resin was injected into the space 114 of the temporary bonded member 110 from outside through the communicating coupling hole 152b and the thermocouple hole 21, with a pressure of 0.04 MPa. Then, when the space 114 was filled with the fluid adhesive 131 and the path 112 was closed, the injection of the fluid adhesive 131 was ended. Then, the outer peripheral adhesive tape 132b was used to close the path 112 from outside as shown in FIG. 11, and hence the path 112 was sealed.

Then, the temporary bonded member 110 with the fluid adhesive 131 injected was left in a stationary manner in the air for 10 hours. Then, the temporary bonded member 110 was put in the atmosphere furnace at 150° C. for 8 hours and hence the fluid adhesive 131 was hardened. Further, the fixture 150 was detached. Then, the temporary bonded member 110 was put in vacuum (less than $1\times10^{-3}$ Pa) and baked at 150° C. for 80 hours. Thus, the fluid adhesive 131 was completely hardened. Accordingly, the wafer mount device 10 of Example 1 was obtained.

Example 2

A wafer mount device 10 of Example 2 was manufactured in a manner similar to Example 1 except that the intermediate layer 143 of the double-faced tape 140 was made of PET resin and the sticking layers 142 and 144 are made of acrylic resin, and the double-faced tape 140 had a thickness excluding the protection films 141 and 145 of 300 μm, a thickness for each of the sticking layers 142 and 144 of 37.5 μm, and a thickness for the intermediate layer 143 of 75 μm.

Comparative Example 1

A wafer mount device of Comparative Example 1 was manufactured in a manner similar to Example 1 except that the outer peripheral adhesive portion 32 was not provided. Comparative Example 1 was manufactured as follows. First, the plate 12 and the cooling plate 20 were fabricated in a manner similar to Example 1. Next, the fluid adhesive 131 was printed on the front surface of the cooling plate 20 by screen printing, and then the gas-supply-hole adhesive tapes 133, the lift-pin-hole adhesive tapes 134, the terminal-hole adhesive tapes 135 and 136, and the spacers were bonded to the cooling plate 20. Then, the plate 12 and the cooling plate 20 were bonded to each other and hence form the temporary bonded member. The temporary bonded member was fixed by the fixture 150. Then, the fluid adhesive 131 was hardened in the atmosphere furnace and in vacuum in a manner similar to Example 1. Thus, the wafer mount device of Comparative Example 1 was manufactured.

[Evaluation Test 1]

Flatness of the plate 12, gas-sealing performance of the adhesive layer 30, attracting force for the wafer W and detachment time of the wafer W, presence of a defect and hole clogging of the adhesive layer 30, and thermal uniformity of the front surface of the plate 12 were measured for each of the manufactured wafer mount devices of Example 1, Example 2, and Comparative Example 1. The flatness of the plate 12 was measured by measuring heights at 13 points on the front surface of the plate 12 by a three-coordinate measuring machine, and considering the difference between the maximum height and the minimum height as the flatness. The gas-sealing performance was evaluated by closing the gas supply holes 23, the lift pin holes 24, and the terminal holes 25 and 26 except for a hole to be measured, measuring a helium leak amount by a helium leak detector, and performing the measurement for each hole. The attracting force for the wafer W was measured as follows. First, a voltage of 500 V was applied to the electrostatic electrode 14 to cause the silicone wafer W to be attracted to the front surface of the plate 12, and in this state, the backside gas (argon gas) was supplied from the back surface of the cooling plate 20 to the back surface of the wafer W through the gas supply holes 23. While the flow rate of the gas at this time was measured, the gas pressure was gradually increased from 100 Pa. The gas pressure when the flow rate of the gas is rapidly increased was measured. The gas pressure when the flow rate of the gas is rapidly increases was considered as the attracting force for the wafer W. The detachment time of the wafer W was measured as a period of time from when the pressure of the supplied gas was 500 Pa and the applied voltage was 0 V in a state in which the wafer W was attracted to the front surface of the plate 12 to when the flow rate of the gas is rapidly increased. The presence of a defect and hole clogging was evaluated by judging the presence of detection of a defect in the adhesive layer 30 by an ultrasonic flaw detector, and by judging the presence of hole clogging of any of the gas supply holes 23, the lift pin holes 24, and the terminal holes 25 and 26 by visual check or aeration check. The thermal uniformity was evaluated as follows. First, each of the wafer mount devices of Example 1, Example 2, and Comparative Example 1 were provided in a vacuum chamber, and while cooling water at 60° C. flowed through the cooling path 22, the electric power supplied to the resistance heating element 16 was adjusted so that the temperature at the center of the front surface of the plate 12 became 150° C. Then, the temperature distribution on the front surface of the plate 12 was measured by an IR camera in a state at a stable temperature, and the difference ΔT between the maximum value and the minimum value of the temperatures was measured as an index of the thermal uniformity.

[Evaluation Test 2]

To simulate a state in which a wafer mount device was actually used, for the wafer mount devices of Example 1, Example 2, and Comparative Example 1, the temperature was increased and then decreased by 1° C. per second from a room temperature to 150° C., and then to the room temperature as one cycle; and 1000 cycles were performed. Then, a test similar to Evaluation Test 1 was performed.

Table 1 shows the results of Evaluation Tests 1 and 2. As shown in Table 1, good results were obtained for the flatness, the He leak amount, the presence of a defect and hole clogging of both Evaluation Tests 1 and 2 in any of Example 1, Example 2, and Comparative Example 1. However, regarding the attraction/detachment performance (attracting force and detachment time) of Evaluation Test 1, better results were obtained in Examples 1 and 2 than the result of Comparative Example 1. Also, it is found that the detachment time of Evaluation Test 1 in Comparative Example 1 is further longer than that of Evaluation Test 2. The attraction/detachment performance is degraded due to the heat cycle. In contrast, regarding Example 1 and Example 2, the attraction/detachment performance is not changed between Evaluation Test 1 and Evaluation Test 2. It is found that the attraction/detachment performance is not degraded due to the heat cycle in Example 1 and Example 2. Examples 1 and 2 have configurations including the outer peripheral adhesive portion 32 as compared with Comparative Example 2. It can be conceived that the attraction/detachment performance is increased as the result of the difference of the configurations. Also, regarding the difference ΔT, in Evaluation Tests 1 and 2, the values of the differences ΔT in Examples 1 and 2 were smaller than the value in Comparative Example 1, and hence good results were obtained in Examples 1 and 2. In any of Examples 1 and 2, since the temporary bonded member 110 is fabricated and then the fluid adhesive 131 is injected, the amount of the air mixed into the adhesive layer 30 is smaller than that in Comparative Example 1. It can be conceived that the thermal uniformity of the plate 12 is improved.

TABLE 1

| | Evaluation point | Example 1 | Example 2 | Comparative Example 1 |
|---|---|---|---|---|
| Evaluation Test 1 | Flatness (μm) | 15 | 15 | 15 |
| | He leak amount (Pa·m³/s) | $5 \times 10^{-10}$ | $5 \times 10^{-10}$ | $5 \times 10^{-10}$ |
| | Attracting force (Torr) | 75 | 75 | 20 |
| | Detachment time (s) | 2 | 2 | 30 |
| | Presence of a defect and hole clogging | None | None | None |
| | Thermal uniformity $\Delta T$(° C.) | 1.3 | 1.3 | 1.9 |
| Evaluation Test 2 (After 1000 cycles) | Flatness (μm) | 15 | 15 | 15 |
| | He leak amount (Pa·m³/s) | $5 \times 10^{-10}$ | $5 \times 10^{-10}$ | $5 \times 10^{-10}$ |
| | Attracting force (Torr) | 75 | 75 | 20 |
| | Detachment time (s) | 2 | 2 | 60 |
| | Presence of a defect and hole clogging | None | None | None |
| | Thermal uniformity $\Delta T$(° C.) | 1.3 | 1.3 | 1.9 |

The present application claims priority from the Japanese Patent Application No. 2010-107234 filed on May 7, 2010, the entire contents of which are incorporated herein by reference.

What is claimed is:

1. A manufacturing method of a wafer mount device, the method comprising:

(a) a step of preparing a disk-shaped ceramic plate including an electrostatic chuck electrode, and a disk-shaped metal cooling plate having an injection hole and a through hole penetrating through the cooling plate in a thickness direction;

(b) a step of, after the step (a), bonding an outer peripheral edge on a back surface of the plate and an outer peripheral edge on a front surface of the cooling plate together by a double-faced tape, bonding the back surface of the plate and an outer peripheral edge of the through hole on the front surface of the cooling plate together by a double-faced tape, and hence providing a temporary bonded member;

(c) a step of, after the step (b), injecting a fluid adhesive into a space of the temporary bonded member through the injection hole, the space being surrounded by the back surface of the plate, the front surface of the cooling plate, and the double-faced tapes; and (d) a step of, after the step (c), hardening the fluid adhesive.

2. The manufacturing method of the wafer mount device according to claim 1, wherein, in the step (b), a path is provided, the path communicating with an inner peripheral side and an outer peripheral side of the double-faced tape that bonds the outer peripheral edge on the back surface of the plate and the outer peripheral edge on the front surface of the cooling plate together, and wherein, in the step (c), the fluid adhesive is injected into the space through the injection hole such that the air is discharged through the path as the fluid adhesive is injected and that the path is closed with the fluid adhesive last.

3. The manufacturing method of the wafer mount device according to claim 2, wherein the injection hole is located at a position deviated from a center axis of the cooling plate, and wherein, in the step (b), the path is provided at a position opposite to the injection hole with respect to the center axis of the cooling plate.

4. The manufacturing method of the wafer mount device according to claim 2, wherein, in the step (c), after the path is closed with the fluid adhesive, the path is closed with a double-faced tape from outside.

5. The manufacturing method of the wafer mount device according to claim 1, wherein, in the step (d), after the fluid adhesive is injected into the space in the step (c), the temporary bonded member is left until an inner pressure of the fluid adhesive in the space is released, and then the fluid adhesive is hardened.

* * * * *